US009419137B1

(12) United States Patent
Bello et al.

(10) Patent No.: US 9,419,137 B1
(45) Date of Patent: Aug. 16, 2016

(54) STRESS MEMORIZATION FILM AND OXIDE ISOLATION IN FINS

(71) Applicant: GLOBALFOUNDRIES Inc., Grand Cayman (KY)

(72) Inventors: Abner Bello, Clifton Park, NY (US); Xiuyu Cai, Niskayuna, NY (US); Hugh Porter, Clifton Park, NY (US); Daniel Pham, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/641,809

(22) Filed: Mar. 9, 2015

(51) Int. Cl.
*H01L 29/78* (2006.01)
*H01L 21/8234* (2006.01)
*H01L 21/324* (2006.01)
*H01L 21/3105* (2006.01)
*H01L 21/762* (2006.01)
*H01L 27/088* (2006.01)
*H01L 29/06* (2006.01)

(52) U.S. Cl.
CPC ...... *H01L 29/7847* (2013.01); *H01L 21/31055* (2013.01); *H01L 21/324* (2013.01); *H01L 21/76224* (2013.01); *H01L 21/823431* (2013.01); *H01L 21/823481* (2013.01); *H01L 27/0886* (2013.01); *H01L 29/0649* (2013.01)

(58) Field of Classification Search
CPC ......................... H01L 29/7847; H01L 29/785
See application file for complete search history.

(56) References Cited

U.S. PATENT DOCUMENTS

2014/0273379 A1* 9/2014 Tsai et al. ............... 438/283
2015/0249153 A1* 9/2015 Morin ................ H01L 29/7848

OTHER PUBLICATIONS

AMD Saxony LLC, "Integration and optimization of embedded-SiGe, compressive and tensile stressed liner films, and stress memorization in advanced SOI CMOS technologies", IEEE International Electron Devices Meeting IEDM Technical Digest, 2005, 21 Pages.

* cited by examiner

*Primary Examiner* — Marc Armand
(74) *Attorney, Agent, or Firm* — Ditthavong & Steiner, P.C.

(57) ABSTRACT

A method of straining fins of a FinFET device by using a stress memorization film and the resulting device are provided. Embodiments include providing a plurality of bulk Si fins, the plurality of bulk Si fins having a recessed oxide layer therebetween; forming a stress memorization layer over the plurality of bulk Si fins and the recessed oxide layer; annealing the stress memorization layer, the plurality of bulk Si fins, and the recessed oxide layer; and removing the stress memorization layer.

15 Claims, 5 Drawing Sheets

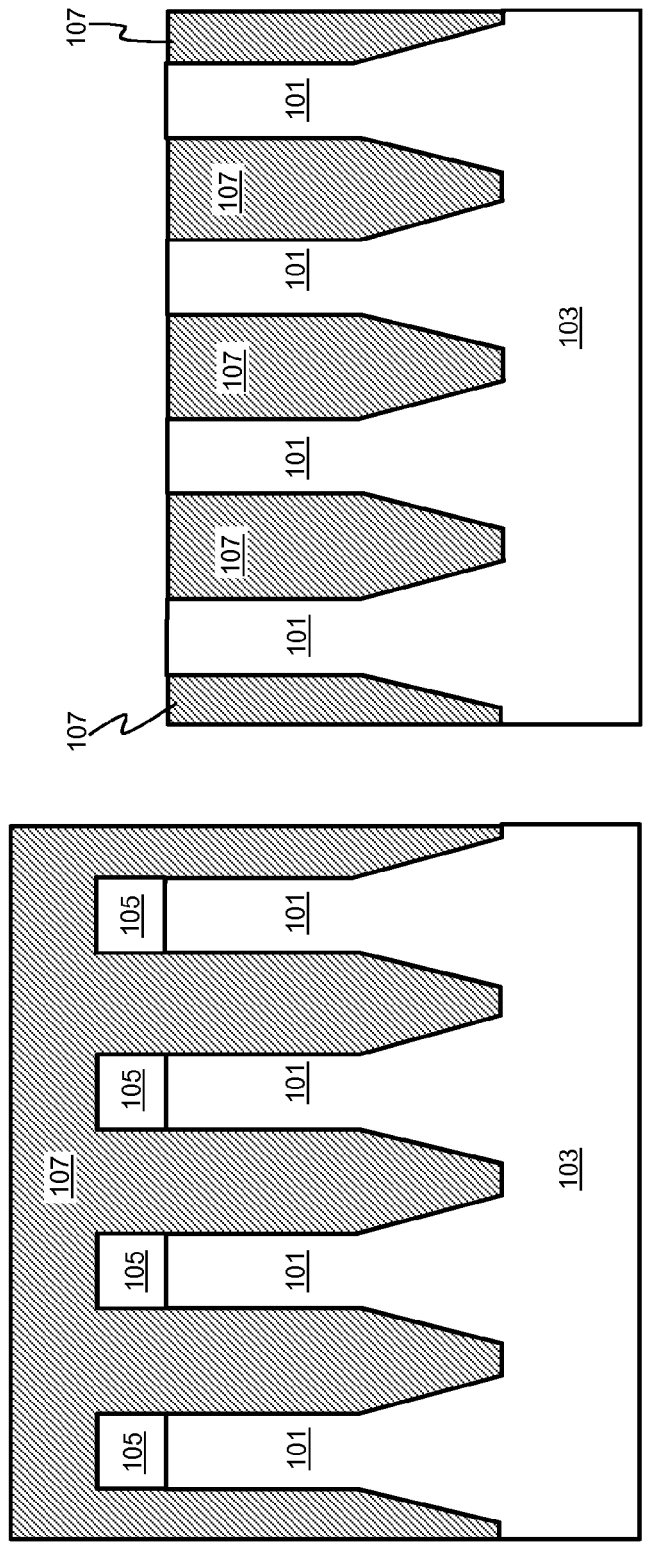

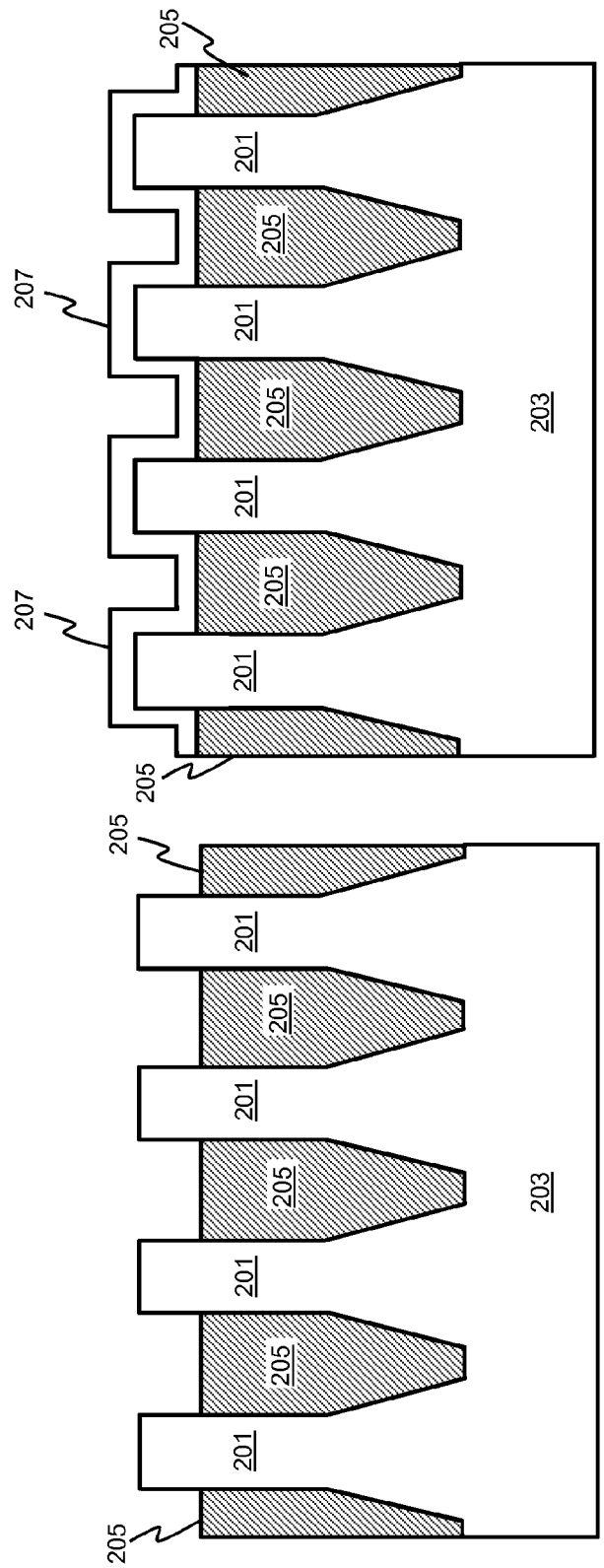

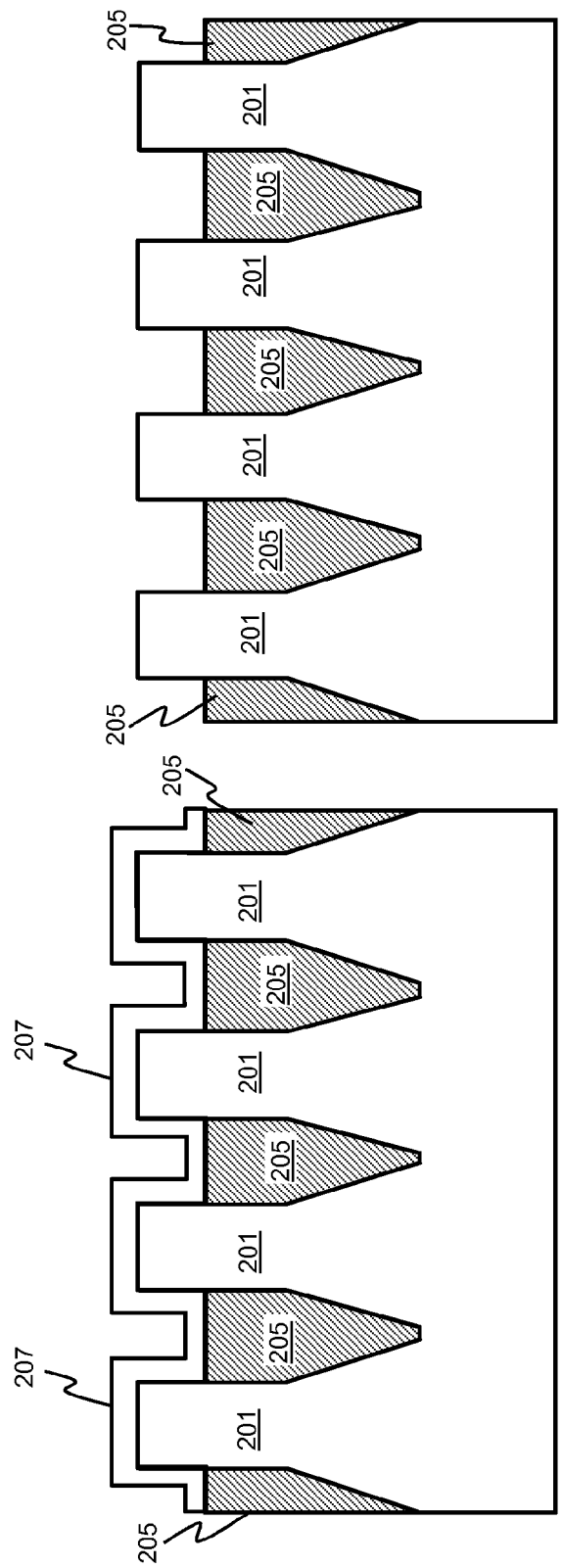

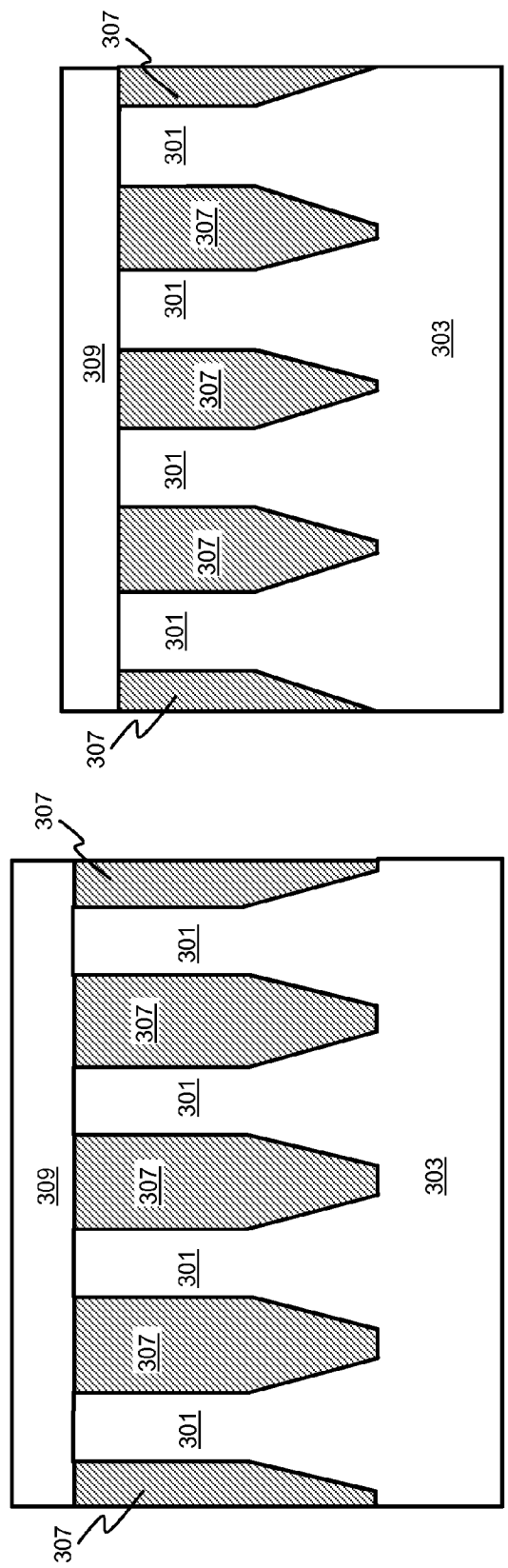

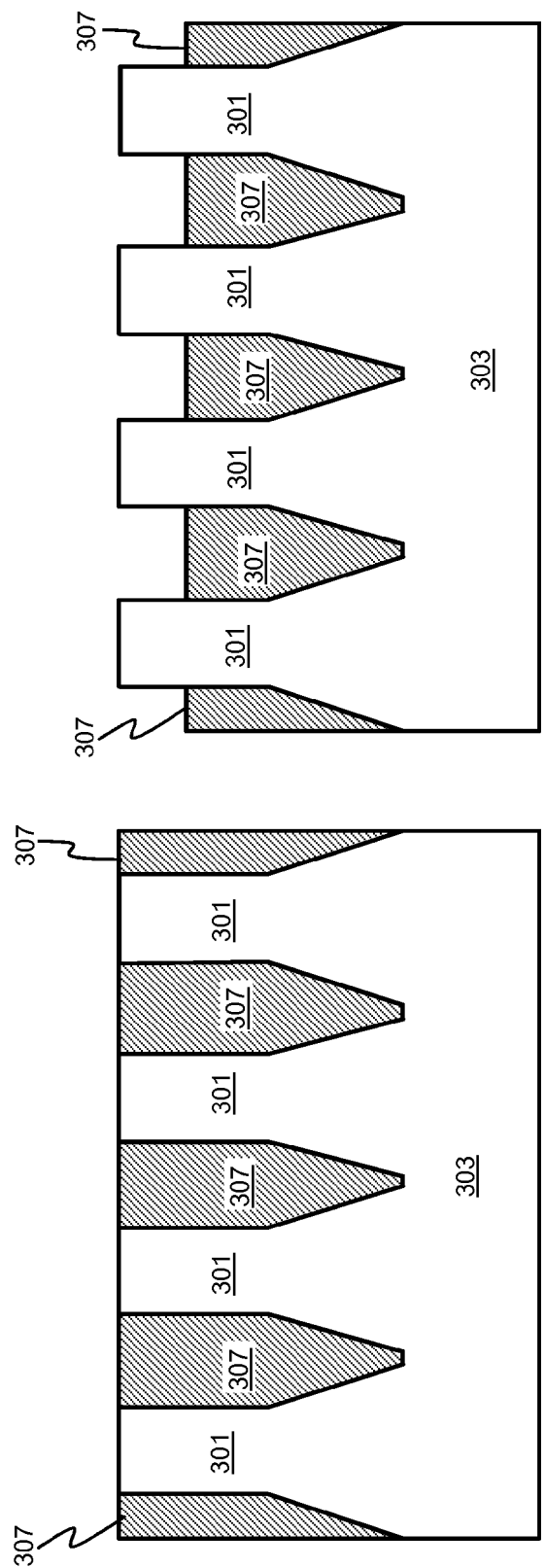

STRESS MEMORIZATION FILM AND OXIDE ISOLATION IN FINS

TECHNICAL FIELD

The present disclosure relates to a fin formation process for fin-type field-effect transistor (FinFET) devices. The present disclosure is particularly applicable to the 14 nanometer (nm) technology node and beyond.

BACKGROUND

The FinFET structure is used for advanced micro-electronic devices. An array of fins is generally formed by lithography and other material processing techniques, e.g., sidewall image transfer (SIT). A known approach for forming FinFET fins is depicted in FIGS. 1A and 1B. Adverting to FIG. 1A, a plurality of bulk silicon (Si) fins 101, i.e., fins that are formed directly from the Si substrate 103 and are contiguous to it, are formed by an etch process that digs into the silicon. A hard mask layer 105, e.g., made of silicon nitride (SiN), is formed on top of each of the plurality of bulk Si fins 101 and used as an etch stop during the fin formation process. An oxide layer 107, e.g., a high aspect ratio process (HARP) oxide, is then used to fill up the etched volume to electrically isolate the plurality of bulk Si fins 101. Next, the oxide layer 107 is planarized, e.g., by chemical mechanical polishing (CMP), down to the plurality of bulk Si fins 101, removing the hard mask layer 105, as depicted in FIG. 1B. Consequently, the resulting device may have the problem of dishing between the plurality of bulk Si fins 101 (not shown for illustrative convenience). In the final transistor device, current runs through the plurality of bulk Si fins 101. Electronic performance is improved if the carrier mobility in the bulk Si fins 101 is increased. Mobility can by modulated by the strain in the bulk Si fins 101. Baseline processes can generate stress in fins; however, not in the direction advantageous for a p-type FET (pFET).

A need therefore exists for methodology enabling increased mobility in FinFET structures with minimal disruption of the typical process flow and the resulting device.

SUMMARY

An aspect of the present disclosure is a process of straining fins of a FinFET device by using a stress memorization film.

Another aspect of the present disclosure is a FinFET device including strained fins for greater carrier mobility.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a plurality of bulk Si fins, the plurality of bulk Si fins having a recessed oxide layer therebetween; forming a stress memorization layer over the plurality of bulk Si fins and the recessed oxide layer; annealing the stress memorization layer, the plurality of bulk Si fins, and the recessed oxide layer; and removing the stress memorization layer.

Aspects of the present disclosure include forming the stress memorization layer of a material that has a bulk modulus higher than Si and oxide or silicon oxide (SiOx). Other aspects include forming the stress memorization layer of SiNx, aluminum oxide ($Al_2O_3$), lanthanum oxide ($La_2O_3$), boron nitride (BN), aluminum nitride (AlN), or gallium nitride (GaN). Further aspects include forming the oxide layer of HARP. Another aspect includes forming the stress memorization layer to a thickness of 0.1 nm to 200 nm. Additional aspects include annealing the stress memorization layer, the plurality of bulk Si fins, and the recessed oxide layer by laser anneal or rapid thermal anneal. Other aspects include annealing the stress memorization layer, the plurality of bulk Si fins, and the recessed oxide layer at a temperature of 300° C. to 1400° C. Further aspects include annealing the stress memorization layer, the plurality of bulk Si fins, and the recessed oxide layer at a pressure of 1 milliTorr (mTorr) to 760 Torr.

Another aspect of the present disclosure is a method including: forming a plurality of bulk Si fins, each bulk Si fin having a hard mask layer; forming an oxide layer over the plurality of bulk Si fins; planarizing the oxide layer down to the plurality of bulk Si fins; forming a stress memorization layer over the plurality of bulk Si fins and the oxide layer; annealing the stress memorization layer, the plurality of bulk Si fins, and the oxide layer; and removing the stress memorization layer.

Aspects of the present disclosure include planarizing the oxide layer by CMP. Other aspects include forming the stress memorization layer of a material that has a bulk modulus higher than Si and oxide or SiOx. Further aspects include forming the stress memorization layer of SiNx, $Al_2O_3$, $La_2O_3$, BN, AlN, or GaN. Another aspect includes forming the stress memorization layer to a thickness of 0.1 nm to 200 nm. Additional aspects include annealing the stress memorization layer, the plurality of bulk Si fins, and the oxide layer by laser anneal or RTA. Other aspects include annealing the stress memorization layer, the plurality of bulk Si fins, and the oxide layer at a temperature of 300° C. to 1400° C. Further aspects include annealing the stress memorization layer, the plurality of bulk Si fins, and the oxide layer at a pressure of 1 mTorr to 760 Torr. Another aspect includes comprising recessing the oxide layer between the plurality of bulk Si fins after removing the stress memorization layer.

A further aspect of present disclosure is a device including: a Si substrate; a plurality of strained bulk Si fins; and an oxide isolation layer between the plurality of strained bulk Si fins. Aspects of the device include the strained bulk Si fins being strained uniformly across each fin. Other aspects include the strained bulk Si fins being strained non-uniformly along a fin height direction.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B schematically illustrate a background process flow for forming FinFET fins;

FIGS. 2A through 2D schematically illustrate a process flow for forming strained FinFET fins, in accordance with an exemplary embodiment; and FIGS. 3A through 3D schematically illustrate another process flow for forming strained FinFET fins, in accordance with another exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient carrier mobility, resulting in reduced electronic performance attendant upon fabricating FinFET devices by conventional methods.

Methodology in accordance with embodiments of the present disclosure includes providing a plurality of bulk Si fins, the plurality of bulk Si fins having a recessed oxide layer therebetween. A stress memorization layer is formed over the plurality of bulk Si fins and the recessed oxide layer. The stress memorization layer, the plurality of bulk Si fins, and the recessed oxide layer are annealed, and the stress memorization layer is removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Adverting to FIG. 2A, once the plurality of bulk Si fins 201 are formed from the Si substrate 203 and the oxide layer 205 is formed, e.g., of HARP, and then planarized, e.g., by CMP, as described above with respect to FIGS. 1A and 1B, the oxide layer 205 is recessed, for example, 2 nm to 50 nm. A stress memorization layer 207 is then deposited over the plurality of bulk Si fins 201 and the oxide layer 205, as depicted in FIG. 2B. The stress memorization layer 207 is formed of a material that has a bulk modulus higher than the bulk Si fins 201 and the oxide layer 205, i.e., the stress memorization layer 207 will not change when the bulk Si fins 201 and the oxide layer 205 oxide are subsequently stressed by annealing. The stress memorization layer 207 may be formed, e.g., of $SiN_x$, where x defines the ratio of N to Si, $Al_2O_3$, $La_2O_3$, BN, AlN, or GaN. Further, the stress memorization layer 207 may be formed to a thickness of 0.1 nm to 200 nm.

Adverting to FIG. 2C, the plurality of bulk Si fins 201, the stress memorization layer 207, and the oxide layer 205 are annealed, for example, by laser anneal or RTA. Annealing the oxide layer 205 densifies the layer for better insulator and reliability performance. The plurality of bulk Si fins 201, the stress memorization layer 207, and the oxide layer 205 may be annealed, for example, at a temperature of 300° C. to 1400° C. and at a pressure of 1 milliTorr to 760 Torr. Further, the plurality of bulk Si fins 201, the stress memorization layer 207, and the oxide layer 205 may be annealed, for example, for a milli second to hours depending on the annealing process. As a result of the annealing process, the oxide layer 205 contracts and the plurality of bulk Si fins 201 are strained because the Si is softer than the oxide. Further, the strain induces the plurality of bulk Si fins 201 to shorten, e.g., by 30 nm to 200 nm, and widen, e.g., by 3 nm to 50 nm, i.e., changing approximately 1% to 3% in height and width. The stress memorization layer 207 is then removed and the stress, which is generated non-uniformly along the fin height direction, remains in the plurality of bulk Si fins 201, as depicted in FIG. 2D. Removal of the stress memorization layer 207 does not change the strain in the plurality of bulk Si fins 201 because the oxide layer 205, which has a relatively much larger volume, remains compressed.

FIGS. 3A through 3D schematically illustrate another process flow for forming strained FinFET fins, in accordance with another exemplary embodiment. Adverting to FIG. 3A, once the plurality of bulk Si fins 301 are formed from the Si substrate 303 and the oxide layer 305 is formed and then planarized, e.g., by CMP, as described above with respect to FIGS. 1A and 1B, a stress memorization layer 309 is deposited over the plurality of bulk Si fins 301 and the oxide layer 307, as depicted in FIG. 3B. The stress memorization layer 309 and the stress memorization 207 are formed in the same manner as described above. Adverting to FIG. 3C, the stress memorization layer 309, the plurality of bulk Si fins 301, and the oxide layer 307 are then annealed in the same manner as the stress memorization layer 207, the plurality of bulk Si fins 201, and the oxide layer 205, as described above. Again, as a result of the annealing process, the oxide layer 307 contracts and the plurality of bulk Si fins 301 are strained. The strain induces the plurality of bulk Si fins 301 to shorten and widen in the same manner as the bulk Si fins 201, as described above. The stress memorization layer 309 is then removed, and the stress, which in this case is generated uniformly across the plurality of bulk Si fins 301, remains in the plurality of bulk Si fins 301, as depicted in FIG. 3C. As described above, the removal of the stress memorization layer 309 does not change the strain in the plurality of bulk Si fins 301 because the oxide layer 307, which has a relatively much larger volume, remains compressed. Thereafter, the oxide layer 307 may be recessed in preparation for gate material deposition, as depicted in FIG. 3D.

The embodiments of the present disclosure can achieve several technical effects including better device electronic performance, e.g., increased current density given the same input parameters for a device operation, through stress in the fins with minimal disruption to the typical process flow. Moreover, the present disclosure achieves enhanced stress in the direction advantageous for a pFET. Further, for a different oxide, the stress in two different directions can be modulated. Thus, the present disclosure potentially enables the stress to be engineered in one direction independent of the other direction. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in 14 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a plurality of bulk silicon (Si) fins, the plurality of bulk Si fins having a recessed oxide layer therebetween;
   forming a stress memorization layer over the plurality of bulk Si fins and the recessed oxide layer;
   annealing the stress memorization layer, the plurality of bulk Si fins, and the recessed oxide layer by laser anneal or rapid thermal anneal; and
   removing the stress memorization layer in its entirety.

2. The method according to claim 1, comprising forming the stress memorization layer of a material that has a bulk modulus higher than Si and oxide or silicon oxide (SiOx).

3. The method according to claim 1, comprising forming the oxide layer of high aspect ratio process (HARP) oxide.

4. The method according to claim 1, comprising forming the stress memorization layer to a thickness of 0.1 nanometer (nm) to 200 nm.

5. The method according to claim 1, comprising annealing the stress memorization layer, the plurality of bulk Si fins, and the recessed oxide layer at a temperature of 300° C. to 1400° C.

6. The method according to claim 1, comprising annealing the stress memorization layer, the plurality of bulk Si fins, and the recessed oxide layer at a pressure of 1 milliTorr (mTorr) to 760 Torr.

7. The method according to claim 2, comprising forming the stress memorization layer of silicon nitride (SiNx), aluminum oxide ($Al_2O_3$), lanthanum oxide ($La_2O_3$), boron nitride (BN), aluminum nitride (AlN), or gallium nitride (GaN).

8. A method comprising:
   forming a plurality of bulk silicon (Si) fins, each bulk Si fin having a hard mask layer;
   forming an oxide layer over the plurality of bulk Si fins;
   planarizing the oxide layer down to the plurality of bulk Si fins;
   forming a stress memorization layer over the plurality of bulk Si fins and the oxide layer;
   annealing the stress memorization layer, the plurality of bulk Si fins, and the oxide layer by laser anneal or rapid thermal anneal (RTA); and
   removing the stress memorization layer in its entirety.

9. The method according to claim 8, comprising planarizing the oxide layer by chemical mechanical polishing (CMP).

10. The method according to claim 8, comprising forming the stress memorization layer of a material that has a bulk modulus higher than Si and oxide or silicon oxide (SiOx).

11. The method according to claim 8, comprising forming the stress memorization layer of silicon nitride (SiNx), aluminum oxide ($Al_2O_3$), lanthanum oxide ($La_2O_3$), boron nitride (BN), aluminum nitride (AlN), or gallium nitride (GaN).

12. The method according to claim 8, comprising forming the stress memorization layer to a thickness of 0.1 nanometer (nm) to 200 nm.

13. The method according to claim 8, comprising annealing the stress memorization layer, the plurality of bulk Si fins, and the oxide layer at a temperature of 300° C. to 1400° C.

14. The method according to claim 8, comprising annealing the stress memorization layer, the plurality of bulk Si fins, and the oxide layer at a pressure of 1 milliTorr (mTorr) to 760 Torr.

15. The method according to claim 8, further comprising recessing the oxide layer between the plurality of bulk Si fins after removing the stress memorization layer.

* * * * *